(12) United States Patent
Kim

(10) Patent No.: US 11,855,075 B2
(45) Date of Patent: Dec. 26, 2023

(54) ELECTROSTATIC DISCHARGE PROTECTION CIRCUIT

(71) Applicant: SK hynix Inc., Icheon-si Gyeonggi-do (KR)

(72) Inventor: Do Hee Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/846,569

(22) Filed: Jun. 22, 2022

(65) Prior Publication Data
US 2023/0215863 A1 Jul. 6, 2023

(30) Foreign Application Priority Data
Jan. 6, 2022 (KR) .................. 10-2022-0002195

(51) Int. Cl.
*H01L 27/02* (2006.01)
*H02H 9/04* (2006.01)

(52) U.S. Cl.
CPC ......... *H01L 27/0266* (2013.01); *H02H 9/046* (2013.01)

(58) Field of Classification Search
CPC ............. H01L 27/0266; H01L 27/0262; H01L 27/027; H01L 27/0277; H01L 27/0288; H01L 27/0296; H02H 9/046
USPC ........................................................ 361/56
See application file for complete search history.

(56) References Cited

U.S. PATENT DOCUMENTS

| | | | | |
|---|---|---|---|---|
| 5,659,261 A * | 8/1997 | Bacrania | ............. | G05F 3/30 327/437 |
| 7,250,660 B1 * | 7/2007 | Huang | ............. | H01L 27/0266 257/361 |
| 7,372,679 B1 * | 5/2008 | Ho | ............. | H02H 9/046 361/111 |
| 7,522,395 B1 * | 4/2009 | Tien | ............. | H02H 9/046 361/111 |
| 9,576,948 B2 | 2/2017 | Komatsu et al. | | |
| 11,145,657 B1 * | 10/2021 | Or-Bach | ............. | H01L 21/823475 |
| 2015/0070806 A1 * | 3/2015 | Parthasarathy | ............. | H02H 9/04 361/57 |
| 2019/0020194 A1 * | 1/2019 | Liu | ............. | H02H 1/0007 |

FOREIGN PATENT DOCUMENTS

KR 100506970 B1 10/2005

* cited by examiner

*Primary Examiner* — Dharti H Patel
(74) *Attorney, Agent, or Firm* — WILLIAM PARK & ASSOCIATES LTD.

(57) ABSTRACT

An electrostatic discharge protection circuit includes a pull-down switch, a dummy pattern arranged parallel to the pull-down switch in a first direction, clamp switches arranged parallel to each other in the first direction between the dummy pattern and the pull-down switch, and a resistor configured to transfer a power supply voltage supplied through a power terminal to a gate pattern of the pull-down switch by being arranged parallel to the pull-down switch. Drains of the clamp switches are coupled in common to the power terminal, sources of the clamp switches are coupled in common to a ground terminal, and a first end of the pull-down switch and a second end of the resistor are coupled to each other through a first conductive line extending in the first direction, the pull-down switch, the resistor and the first conductive line are formed in a same layer.

20 Claims, 12 Drawing Sheets

ELECTROSTATIC DISCHARGE PROTECTION CIRCUIT

CROSS-REFERENCE TO RELATED APPLICATION

The present application claims priority under 35 U.S.C. § 119(a) to Korean patent application number 10-2022-0002195 filed on Jan. 6, 2022, in the Korean Intellectual Property Office, the entire disclosure of which is incorporated by reference herein.

BACKGROUND

1. Technical Field

Various embodiments of the present disclosure generally relate to an electrostatic discharge protection circuit, and more particularly, to an electrostatic discharge protection circuit including clamp switches.

2. Related Art

Static electricity is the transfer of charge generated by frictional electricity between two objects having different potentials. Static electricity is an imbalance of electric charges. Static electricity has a low current when the electricity is charged, and transfers with a high current in a short time when a charged level reaches to a limit level. Static electricity may occur not only in electronic devices but also in human bodies or various kinds of objects. When static electricity occurs in an electronic device, elements or devices constituting the electronic device may be damaged by the static electricity.

Accordingly, an electrostatic discharge protection circuit may be used in an electronic device in order to protect components within the device from static electricity.

SUMMARY

Various embodiments of the present disclosure are directed to an electrostatic discharge protection circuit having a reduced size.

In accordance with an embodiment of the present disclosure, an electrostatic discharge protection circuit may include a pull-down switch, a dummy pattern arranged parallel to the pull-down switch in a first direction, clamp switches arranged parallel to each other in the first direction between the dummy pattern and the pull-down switch, and a resistor arranged parallel to the pull-down switch and configured to transfer a power supply voltage supplied through a power terminal to a first gate pattern of the pull-down switch. Drains of the clamp switches may be coupled in common to the power terminal, sources of the clamp switches may be coupled in common to a ground terminal, and a first end of the pull-down switch and a second end of the resistor may be coupled to each other through a first conductive line extending in the first direction. The pull-down switch, the resistor and the first conductive line are formed in a same layer.

BRIEF DESCRIPTION OF THE DRAWINGS

FIGS. 7A to 7F are views illustrating a method of manufacturing an electrostatic discharge protection circuit according to an embodiment of the present disclosure.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Figure 1:
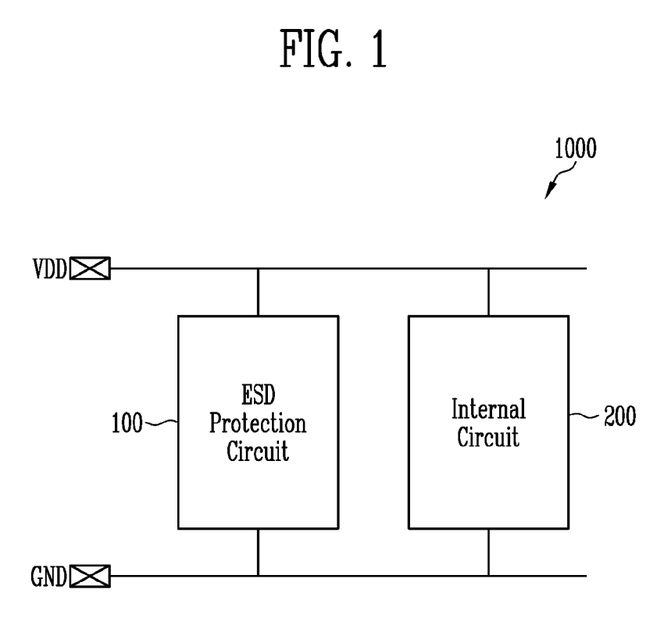
FIG. 1 is a diagram illustrating an electronic device including an electrostatic discharge protection circuit according to an embodiment of the present disclosure.

FIG. 1 is a diagram illustrating an electronic device 1000 including an electrostatic discharge protection circuit according to an embodiment of the present disclosure.

Referring to FIG. 1, the electronic device 1000 may include an electrostatic discharge (ESD) protection circuit 100 and an internal circuit 200.

The ESD protection circuit 100 may be configured such that, when static electricity is generated in a power terminal VDD coupled to the internal circuit 200, the static electricity in the power terminal VDD is discharged through a ground terminal GND.

The internal circuit 200 is a circuit configured to perform main operation, and may be supplied with a power supply voltage through the power terminal VDD and grounded through the ground terminal GND. For example, the internal circuit 200 may include a circuit configured to store data, a circuit configured to output images, or a circuit configured to communicate data, and may be configured with various circuits in addition thereto, depending on the electronic device 1000.

Figure 2:
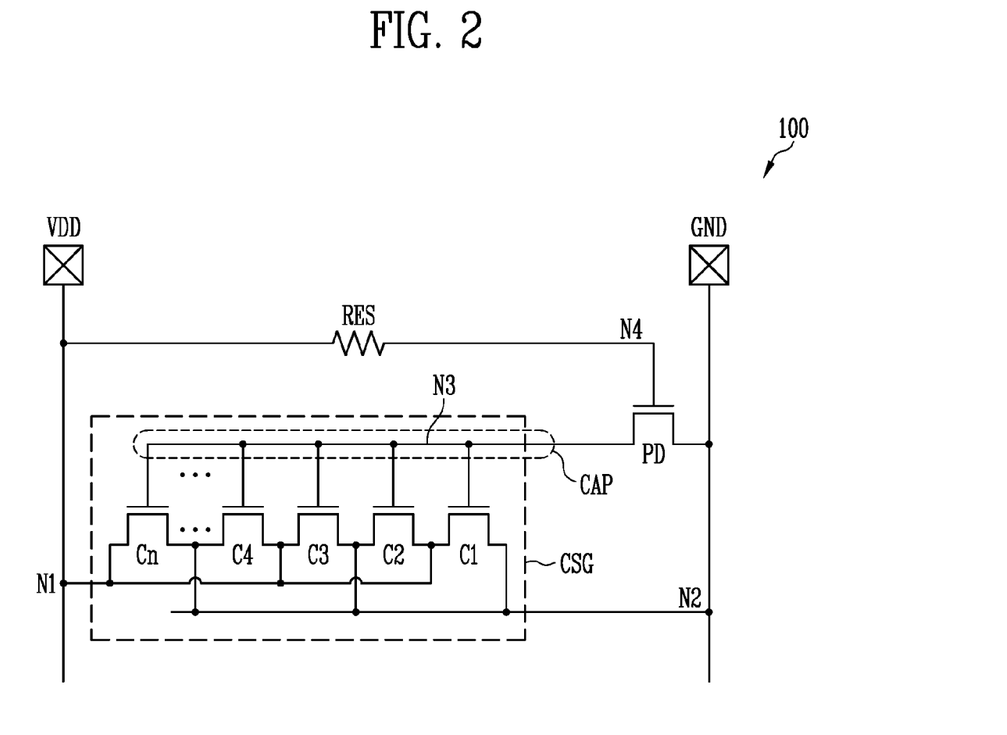
FIG. 2 is a diagram illustrating an electrostatic discharge protection circuit according to an embodiment of the present disclosure.

FIG. 2 is a diagram illustrating an electrostatic discharge protection circuit according to an embodiment of the present disclosure.

Referring to FIG. 2, the electrostatic discharge protection circuit 100 may include a clamp switch group CSG, a pull-down switch PD, and a resistor RES.

The clamp switch group CSG may be coupled between a first node N1 coupled to a power terminal VDD and a second node N2 coupled to a ground terminal GND. The clamp switch group CSG may be configured to discharge a voltage at the first node N1 to the ground terminal GND via the second node N2 when static electricity occurs. For example, the clamp switch group CSG may include first to n-th clamp switches C1 to Cn (where n is a positive integer). Each of the first to n-th clamp switches C1 to Cn may be configured with an NMOS transistor. For example, the first to n-th clamp switches C1 to Cn may be coupled in a gate-coupled NMOS (GCNMOS) structure in which the gates thereof are coupled to each other. For example, the first to n-th clamp switches C1 to Cn may be coupled in series to each other between the second node N2 and the first node N1. The source of the first clamp switch C1 may be coupled to the second node N2, and the drain of the n-th clamp switch Cn may be coupled to the first node N1. The drains of odd-numbered switches, among the first to n-th clamp switches C1 to Cn, may be coupled in common to the first node N1, and the sources thereof may be coupled in common to the second node N2. In other words, the drains of even-numbered switches, among the first to n-th clamp switches C1 to Cn, may be coupled in common to the second node N2, and the sources thereof may be coupled in common to the first node N1. The first to n-th clamp switches C1 to Cn may comprise an odd number of switches such that static electricity occurring at the first node N1 is able to be discharged through the second node N2. The gates of the first to n-th clamp switches C1 to Cn may be coupled in common to a third node N3.

The pull-down switch PD may be configured with an NMOS transistor coupled between the second node N2 and the third node N3. The gate of the pull-down switch PD may be coupled to a fourth node N4, and the resistor RES may be coupled between the fourth node N4 and the first node N1.

A plurality of conductive layers and insulating layers may be included in a structure that couples the drain of the pull-down switch PD to the gates of the first to n-th clamp switches C1 to Cn, and this structure may function as a capacitor CAP between the pull-down switch PD and the first to n-th clamp switches C1 to Cn. Accordingly, the first to n-th clamp switches C1 to Cn may be turned on in response to the voltage with which the capacitor CAP is charged.

Figure 3:
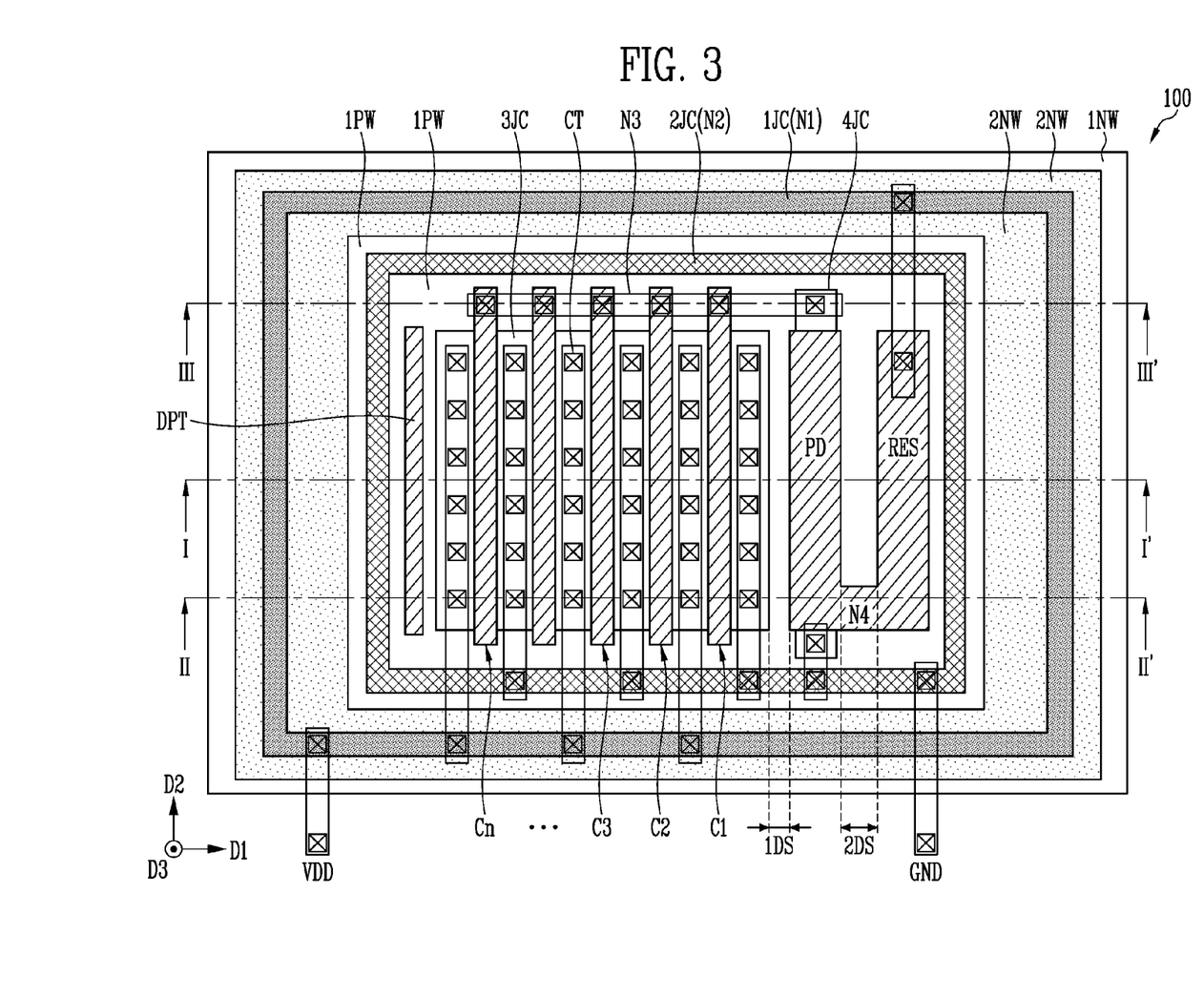
FIG. 3 is a layout diagram illustrating the structure of an electrostatic discharge protection circuit according to an embodiment of the present disclosure.
Figure 4:
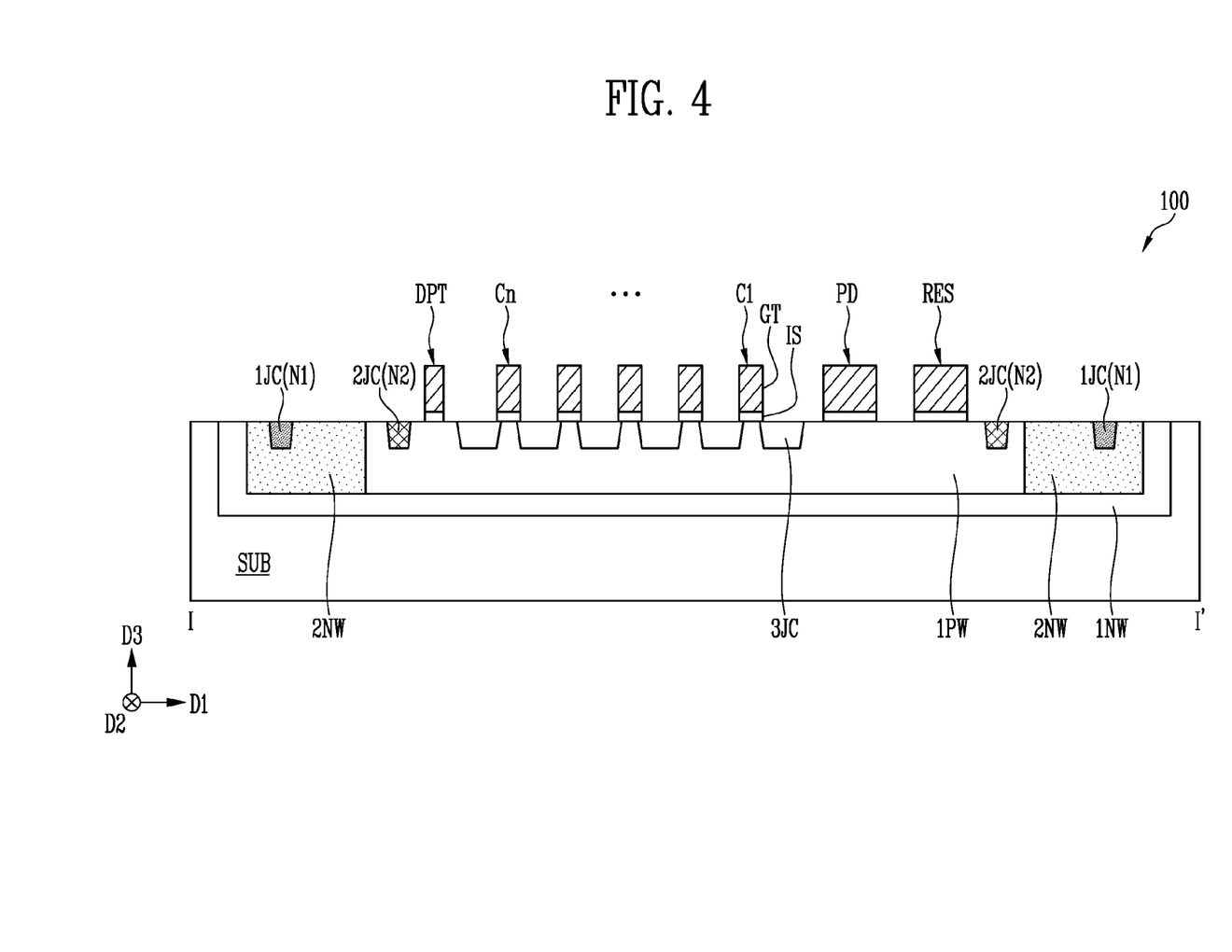
FIG. 4 is a view illustrating the structure of a section taken along line I-I' of the electrostatic discharge protection circuit illustrated in FIG. 3.
Figure 5:
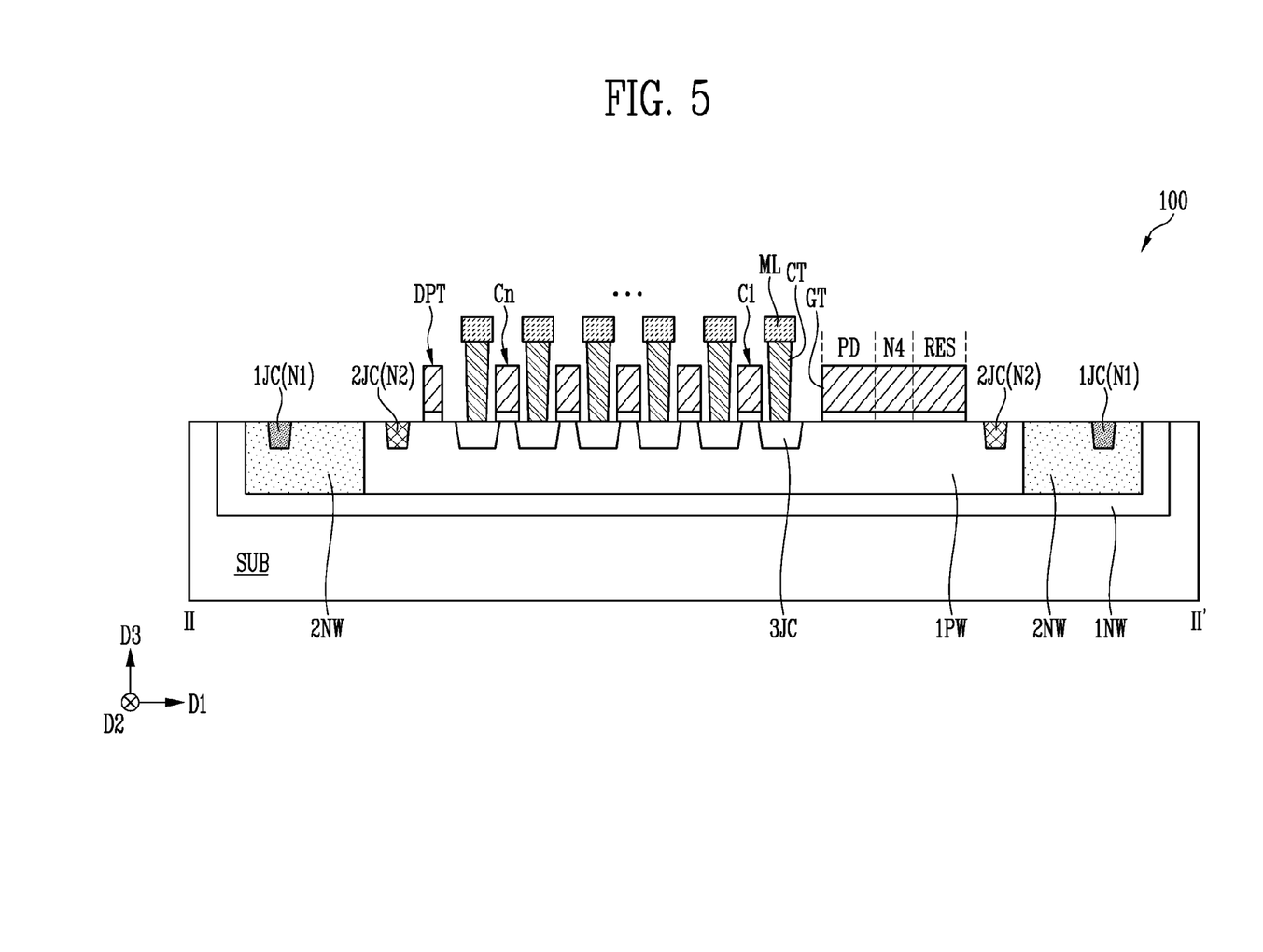
FIG. 5 is a view illustrating the structure of a section taken along line II-II' of the electrostatic discharge protection circuit illustrated in FIG. 3.
Figure 6:
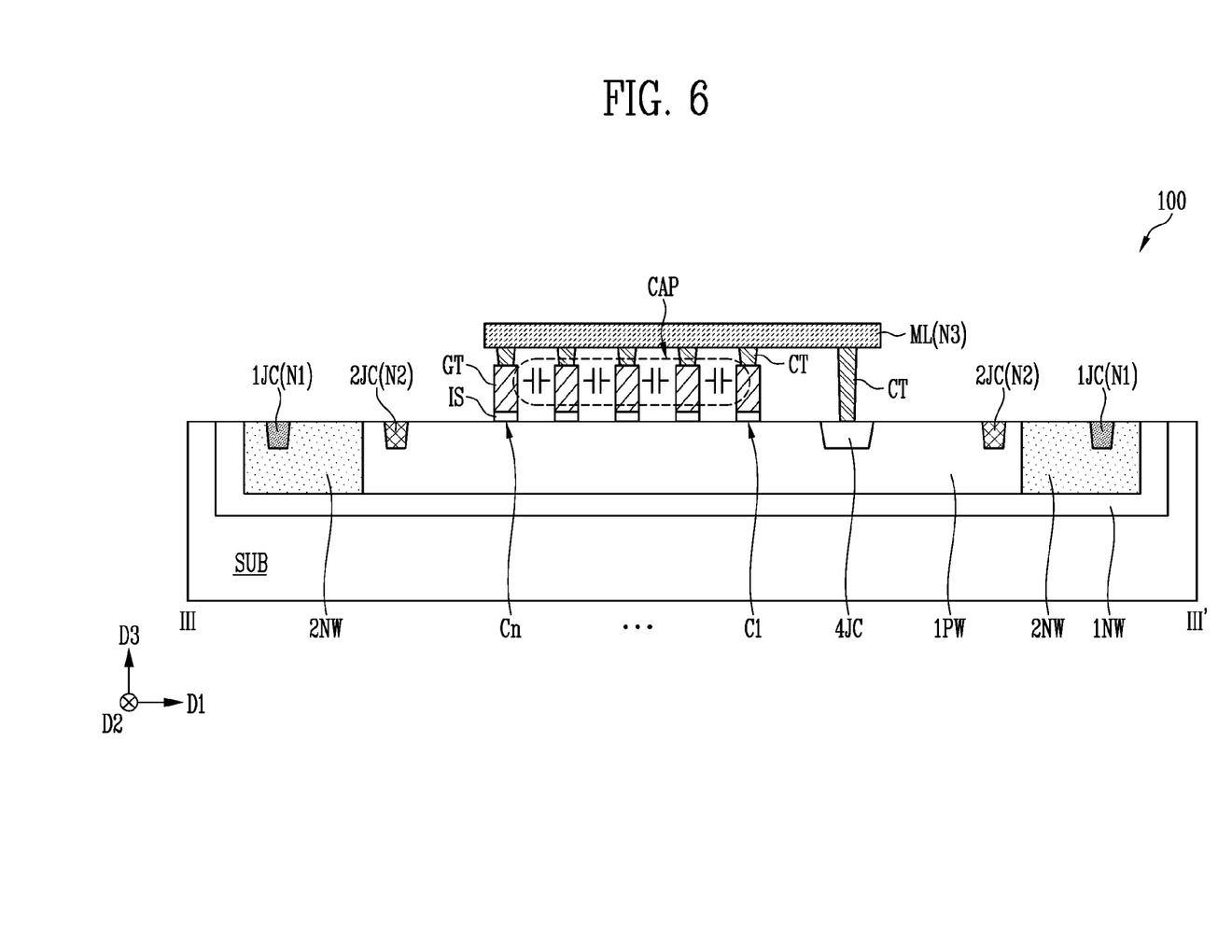
FIG. 6 is a view illustrating the structure of a section taken along line III-III' of the electrostatic discharge protection circuit illustrated in FIG. 3.

FIG. 3 is a layout diagram illustrating the structure of an electrostatic discharge protection circuit 100 according to an embodiment of the present disclosure, FIG. 4 is a view illustrating the structure of a section taken along line I-I' of the electrostatic discharge protection circuit 100 illustrated in FIG. 3, FIG. 5 is a view illustrating the structure of a section taken along line II-II' of the electrostatic discharge protection circuit 100 illustrated in FIG. 3, and FIG. 6 is a view illustrating the structure of a section taken along line III-III' of the electrostatic discharge protection circuit 100 illustrated in FIG. 3.

Referring to FIGS. 3 to 6, the electrostatic discharge protection circuit 100 may include a first N well 1NW formed in a substrate SUB, a second N well 2NW formed in the first N well 1NW, and a first P well 1PW formed in the second N well 2NW, and may include first to n-th clamp switches C1 to Cn, a pull-down switch PD, a resistor RES, and a dummy pattern DPT, which are formed over the first P well 1PW.

When the substrate SUB is formed of P-type silicon, the first N well 1NW may be a deep N well formed in a rectangular shape in the substrate SUB. The second N well 2NW may be formed in a rectangular pattern such that the left and right sides and the bottom thereof are covered by the first N well 1NW. The first N well 1NW and the second N well 2NW are regions into which an N-type impurity is injected in the substrate SUB, and the concentration of the impurity injected into the second N well 2NW may be higher than the concentration of the impurity injected into the first N well 1NW.

A first junction region 1JC may be formed in the second N well 2NW. The first junction region 1JC is a region corresponding to the first node N1 of the electrostatic discharge protection circuit 100, and may be coupled to a power terminal VDD. The first junction region 1JC is a region into which an N-type impurity is injected, and may be formed such that the concentration of the impurity therein is higher than the concentration of the impurity injected into the second N well 2NW.

The first P well 1PW, having the same depth as the second N well 2NW, may be formed in the internal region of the second N well 2NW. The first P well 1PW may be formed by injecting a P-type impurity into the substrate SUB. A second junction region 23C may be formed in the first P well 1PW. The second junction region 23C is a region corresponding to the second node N2 of the electrostatic discharge protection circuit 100, and may be coupled to a ground terminal GND.

The first to n-th clamp switches C1 to Cn, the pull-down switch PD, the resistor RES, and the dummy pattern DPT included in the electrostatic discharge protection circuit 100 may be formed over the first P well 1PW (in a direction D3) enclosed by the second junction region 23C. Each of the first to n-th clamp switches C1 to Cn, the pull-down switch PD, the resistor RES, and the dummy pattern DPT may include an insulating layer IS and a gate pattern GT stacked on the first P well 1PW.

The first to n-th clamp switches C1 to Cn may be arranged in series in a first direction D1. Each of the first to n-th clamp switches C1 to Cn may include gate patterns GT extending in a second direction D2, which is perpendicular to the first direction D1, and third junction regions 33C extending in the second direction D2 and arranged parallel to each other. Clamp switches adjacent to each other, among the first to n-th clamp switches C1 to Cn, may share a drain or a source therebetween. For example, the first and second clamp switches C1 and C2 may share a drain coupled to the first node N1 therebetween, and the second and third clamp switches C2 and C3 may share a source coupled to the second node N2 therebetween.

The gate patterns GT of the first to n-th clamp switches C1 to Cn may extend in the second direction D2, and the ends of the gate patterns GT may be coupled in common to a metal line ML corresponding to the third node N3 through contacts CT (see FIG. 6). The metal line ML corresponding to the third node N3 is also coupled to the junction region of the pull-down switch PD through a contact CT. For example, the metal line ML corresponding to the third node N3 may be coupled through the contact CT formed over the drain of the pull-down switch PD. Because an insulating material fills a space between the gate patterns GT and the contacts CT, which are coupled in common to the metal line ML corresponding to the third node N3, a capacitor CAP in which the contacts CT and gate patterns GT formed of a conductive material are arranged alternately with the insulating material may be formed. The voltage with which the capacitor CAP is charged may be applied to the gate patterns GT of the first to n-th clamp switches C1 to Cn.

The pull-down switch PD may be arranged on the right side of the first clamp switch C1, and the resistor RES may be arranged on the right side of the pull-down switch PD.

The gate pattern GT of the pull-down switch PD may extend in the second direction D2, and the junction region protruding from the gate pattern GT of the pull-down switch PD in the second direction D2 may be coupled to the gate patterns GT of the first to n-th clamp switches C1 to Cn through the third node N3. For example, the junction region protruding from the pull-down switch PD in the second direction D2 may contact the third node N3 through a contact CT. The gate patterns GT of the first to n-th clamp switches C1 to Cn may contact the third node N3 through different contacts CT. The junction region protruding from the gate pattern GT of the pull-down switch PD in the direction opposite the second direction D2 may contact the second junction region 23C through a contact CT.

The gate pattern GT of the pull-down switch PD may contact the resistor RES through a fourth node N4. For example, in the present embodiment, the pull-down switch PD and the resistor RES may be coupled to each other through the fourth node N4 formed in the same plane, rather than through a contact. That is, the insulating layers IS of the pull-down switch PD, the fourth node N4, and the resistor RES may be formed as a single pattern, and the gate patterns GT thereof may be formed as a single pattern stacked on the insulating layer IS. The resistor RES may contact the first junction region 1JC through a contact.

The dummy pattern DPT may be arranged in a region adjacent to the left side of the n-th clamp switch Cn with a gap therebetween. The dummy pattern DPT may be an auxiliary pattern for forming the gate pattern GT of the n-th clamp switch Cn to have a desired pattern in the process of manufacturing the electrostatic discharge protection circuit 100. For example, when a patterning process for forming gate patterns GT and a flattening process are performed, a defect by which a portion of a pattern collapses between a region having a high pattern density and a region having a low pattern density may occur due to the characteristics of the manufacturing process. Accordingly, in the present embodiment, in order to prevent a physical defect in the n-th clamp switch Cn, which may occur during the manufacturing process, a dummy pattern DPT may be formed in a region in which no clamp switches are formed in the region adjacent to the n-th clamp switch Cn.

In the present embodiment, the dummy pattern DPT is formed in order to prevent a physical defect in the n-th clamp switch Cn, but a dummy pattern for preventing a physical defect in the first clamp switch C1 is not used. In the present embodiment, the pull-down switch PD is formed in the region adjacent to the gate pattern GT of the first clamp switch C1 in order to prevent a physical defect that may occur in the first clamp switch C1. For example, in a conventional method, a dummy pattern is formed between the first clamp switch C1 and the pull-down switch PD in order to prevent a physical defect in the first clamp switch C1, but the size of the electrostatic discharge protection circuit 100 increases with an increase in the number of dummy patterns, which are not used electrically. Accordingly, in the present embodiment, the dummy pattern in the region adjacent to the first clamp switch C1 is omitted, and instead, the pull-down switch PD may be formed in the region adjacent to the first clamp switch C1. The pull-down switch PD may be formed to be spaced a fixed first distance 1DS apart from the first clamp switch C1 in order to prevent the gate of the pull-down switch PD from directly contacting a third junction region 33C for the source of the first clamp switch C1. For example, the first distance 1DS may be set to a minimum distance in the overlapping area of the range of a distance for preventing the gate of the first clamp switch C1 from collapsing and the range of a distance for preventing the first clamp switch C1 and the pull-down switch PD from electrically interfering with each other.

In the present embodiment, special contacts for electrically connecting the pull-down switch PD and the resistor RES to each other are not used, because the gate pattern GT of the pull-down switch PD, the gate pattern GT of the fourth node N4, and the gate pattern GT of the resistor RES are formed as a single gate pattern (see FIG. 5). Accordingly, a second distance 2DS between the pull-down switch PD and the resistor RES may be equal to the length of the fourth node N4.

FIGS. 7A to 7F are views illustrating a method of manufacturing an electrostatic discharge protection circuit according to an embodiment of the present disclosure.

Figure 7A:
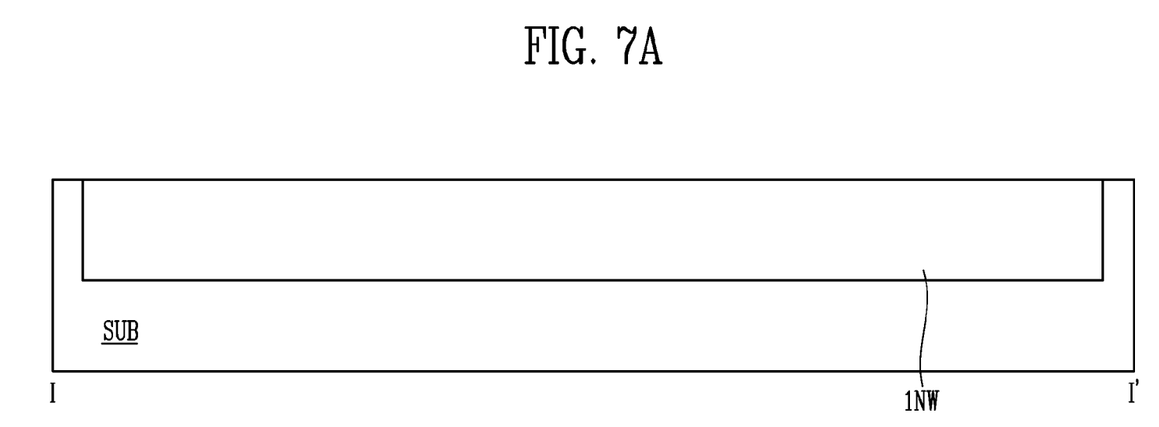

Referring to FIG. 7A, a first N well 1NW may be formed by injecting an N-type impurity into a substrate SUB at a first concentration. The first N well 1NW is a well that defines a region in which semiconductor elements are to be formed, and may be formed as a deep well having the greatest depth.

Figure 7B:
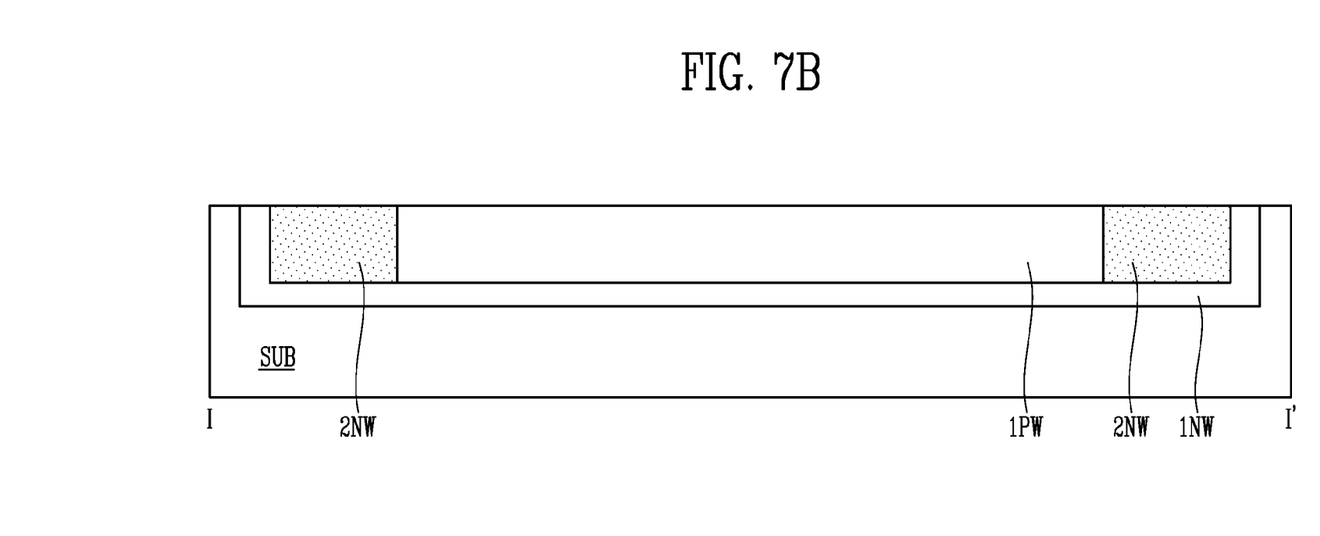

Referring to FIG. 7B, a second N well 2NW and a first P well 1PW, the depths of which are equal to each other and less than the depth of the first N well 1NW, may be formed in the first N well 1NW. For example, the second N well 2NW may be formed by injecting an N-type impurity into the first N well 1NW at a second concentration, which is higher than the first concentration, and the first P well 1PW may be formed by injecting a P-type impurity into the second N well 2NW. Accordingly, the left and right sides and bottom of the second N well 2NW may be covered by the first N well 1NW, the left and right sides of the first P well 1PW may be covered by the second N well 2NW, and the bottom of the first P well 1PW may be covered by the first N well 1NW.

Figure 7C:
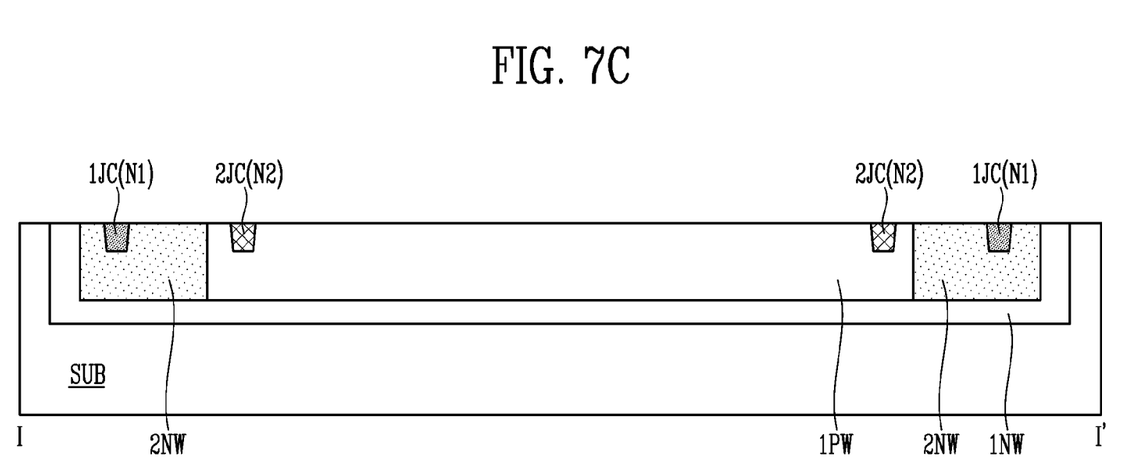

Referring to FIG. 7C, a first junction region 1JC, the top surface of which is exposed, may be formed in the second N well 2NW. For example, the first junction region 1JC may correspond to the first node (N1 of FIG. 2) of the electrostatic discharge protection circuit. The first junction region 13C may be formed by injecting an N-type impurity at a third concentration, which is higher than the second concentration of the second N well 2NW. A second junction region 23C, the top surface of which is exposed, may be formed in the first P well 1PW. For example, the second junction region 23C may correspond to the second node (N2 of FIG. 2) of the electrostatic discharge protection circuit. The second junction region 23C may be formed by injecting a P-type impurity at a concentration higher than the concentration of the P-type impurity injected into the first P well 1PW.

Figure 7D:
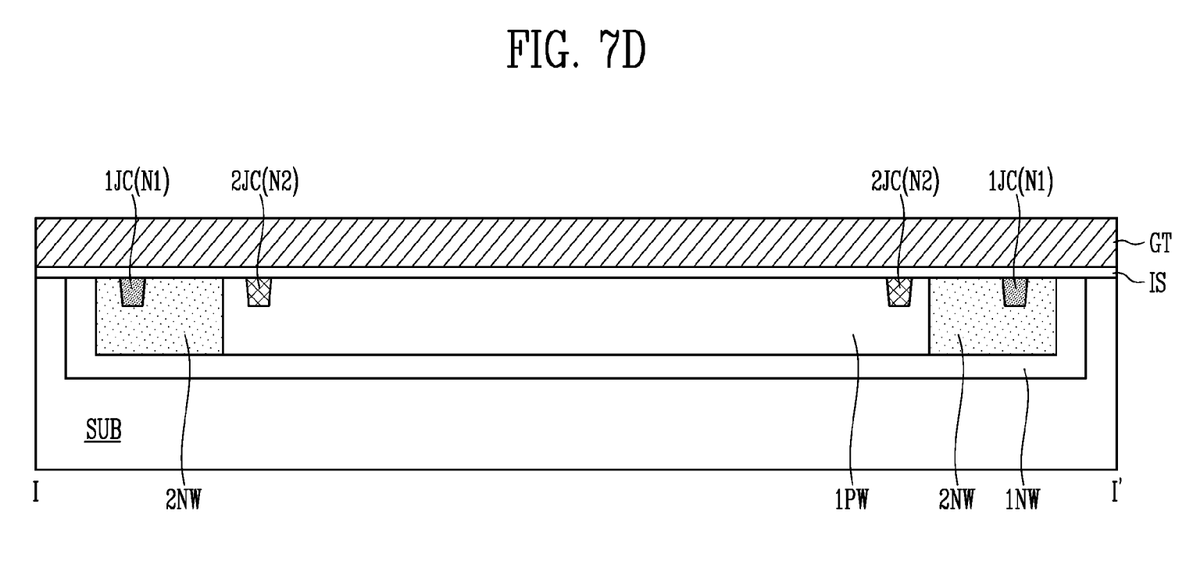

Referring to FIG. 7D, an insulating layer IS is formed on the entire structure in which the first and second junction regions 13C and 23C are formed, and a conductive layer for a gate pattern GT may be formed on the insulating layer IS. The insulating layer IS may be formed of an oxide layer or a silicon oxide layer. The gate pattern GT may be formed of an electrically conductive material, such as polysilicon, tungsten, or nickel, and may be formed of various materials in addition thereto.

Figure 7E:
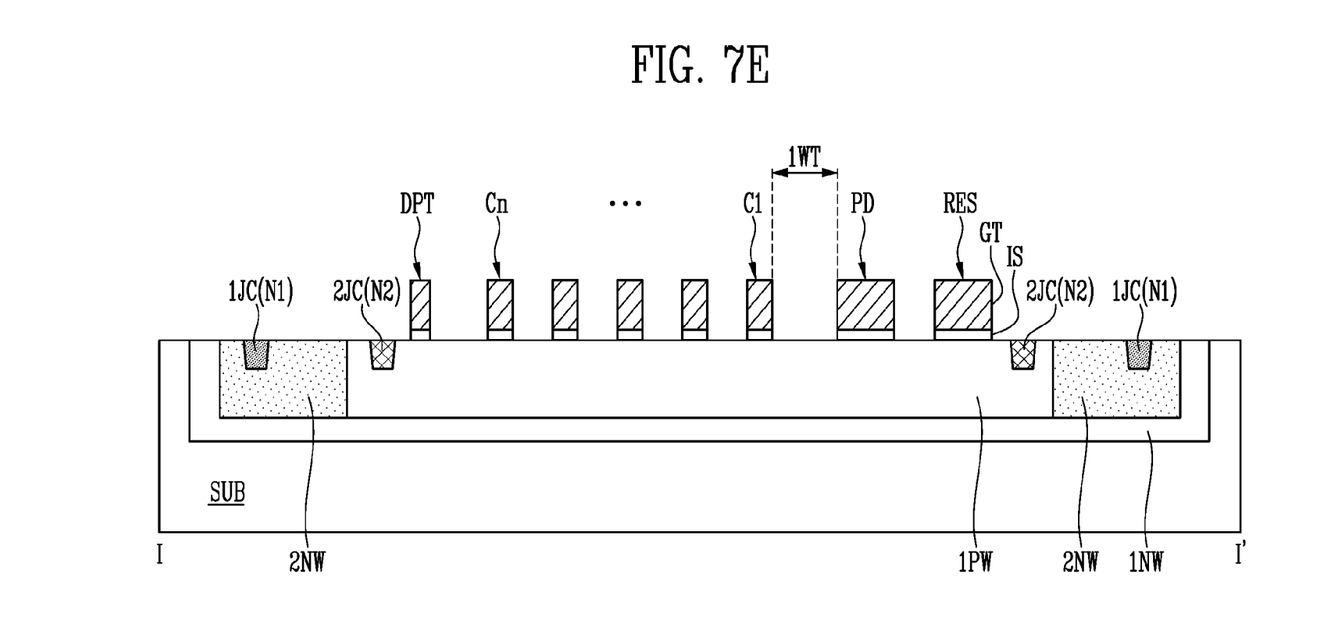

Referring to FIG. 7E, patterns for first to n-th clamp switches C1 to Cn, a pull-down switch PD, and a resistor RES, and a dummy pattern DPT may be formed by patterning the conductive layer for the gate pattern GT and the insulating layer IS. Here, the pattern for the pull-down switch PD and the dummy pattern DPT maintain the density of the pattern in the vicinity of the region in which the first to n-th clamp switches C1 to Cn are formed, thereby being used to prevent physical defects of the patterns for the first to n-th clamp switches C1 to Cn. The distance 1WT between the gate of the first clamp switch C1 and the gate of the pull-down switch PD may be wide in consideration of sizes of contacts CT of FIG. 3.

Figure 7F:
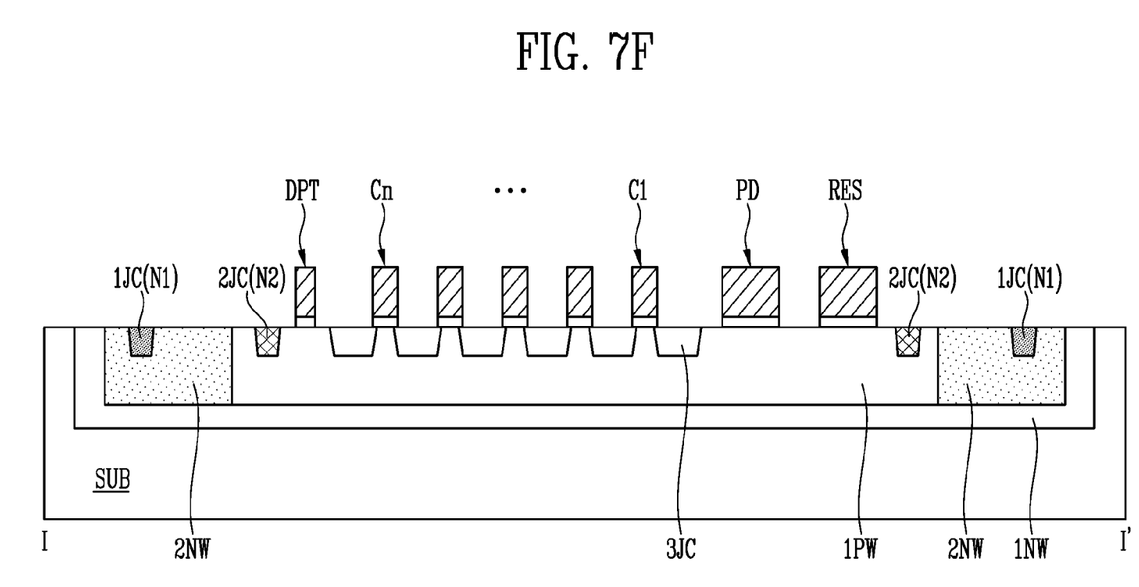

Referring to FIG. 7F, third junction regions 33C may be formed by injecting an impurity into the first P well 1PW, which is exposed between the patterns for the first to n-th clamp switches C1 to Cn. Because the third junction regions 33C constitute the drain or source of the clamp switches, the first to n-th clamp switches C1 to Cn may be formed by forming the third junction regions 33C. Although not illustrated in the sectional view of FIG. 7F, when the third junction regions 33C are formed between the first to n-th clamp switches C1 to Cn, the drain and source of the pull-down switch PD may also be formed simultaneously therewith.

The present technology may reduce the size of an electrostatic discharge protection circuit.

What is claimed is:

1. An electrostatic discharge protection circuit, comprising:
    a pull-down switch;
    a dummy pattern arranged parallel to the pull-down switch in a first direction;
    clamp switches arranged parallel to each other in the first direction between the dummy pattern and the pull-down switch; and
    a resistor arranged parallel to the pull-down switch and configured to transfer a power supply voltage supplied through a power terminal to a first gate pattern of the pull-down switch,
    wherein drains of the clamp switches are coupled in common to the power terminal,
    wherein sources of the clamp switches are coupled in common to a ground terminal, and
    wherein a first end of the pull-down switch and a second end of the resistor are coupled to each other through a first conductive line extending in the first direction, the pull-down switch, the resistor and the first conductive line are formed in a same layer.

2. The electrostatic discharge protection circuit according to claim 1, wherein the first gate pattern:
    extends in a second direction perpendicular to the first direction, and
    includes the first end of the pull-down switch and a third end of the pull-down switch in a direction opposite to the first end.

3. The electrostatic discharge protection circuit according to claim 2, wherein the pull-down switch includes:
    a source contacting the first end of the pull-down switch; and
    a drain contacting the third end of the pull-down switch.

4. The electrostatic discharge protection circuit according to claim 1, wherein the clamp switches:
    extend in a second direction perpendicular to the first direction, and
    include second gate patterns arranged parallel to each other in the first direction.

5. The electrostatic discharge protection circuit according to claim 4, wherein the drains and the sources of the clamp switches are alternately arranged parallel to each other in the first direction between the second gate patterns.

6. The electrostatic discharge protection circuit according to claim 4, wherein fourth ends of the second gate patterns are coupled to a drain of the pull-down switch through contacts and a second conductive line.

7. The electrostatic discharge protection circuit according to claim 6, wherein the contacts include:
    first contacts formed over the fourth ends of the second gate patterns; and
    a second contact formed over the drain of the pull-down switch.

8. The electrostatic discharge protection circuit according to claim 7, wherein the second conductive line is disposed over the first contacts and the second contact.

9. The electrostatic discharge protection circuit according to claim 1, wherein the dummy pattern, the clamp switches, the pull-down switch, the first conductive line, and the resistor are formed over a first well.

10. The electrostatic discharge protection circuit according to claim 9, further comprising a first junction region in the first well, wherein:
    a top surface of the first junction region is exposed at a top of the first well, and
    the first junction region has a rectangular pattern enclosing the dummy pattern, the clamp switches, the pull-down switch, the first conductive line, and the resistor.

11. The electrostatic discharge protection circuit according to claim 10, wherein the first junction region is electrically coupled to the ground terminal.

12. The electrostatic discharge protection circuit according to claim 10, further comprising a second well, wherein:
    the second well comprises an N-type impurity injected into a substrate, and
    the second well encloses the first well.

13. The electrostatic discharge protection circuit according to claim 12, wherein a depth of the second well is equal to a depth of the first well.

14. The electrostatic discharge protection circuit according to claim 12, further comprising a second junction region in the second well, wherein:
    a top surface of the second junction region is exposed at a top of the second well, and
    the second junction region has a rectangular pattern enclosing the first well in a region spaced apart from the first well.

15. The electrostatic discharge protection circuit according to claim 14, wherein the second junction region is electrically coupled to the power terminal.

16. The electrostatic discharge protection circuit according to claim 12, further comprising a third well, wherein:
    the third well comprises an N-type impurity injected into the substrate, and
    the third well encloses the second well.

17. The electrostatic discharge protection circuit according to claim 16, wherein a concentration of the N-type impurity included in the third well is lower than a concentration of the N-type impurity included in the second well.

18. The electrostatic discharge protection circuit according to claim 16, wherein a depth of the third well is greater than a depth of the second well.

19. The electrostatic discharge protection circuit according to claim 9, wherein the first well comprises a P-type impurity injected into a substrate.

20. The electrostatic discharge protection circuit according to claim 9, wherein a source of a first clamp switch, which is adjacent to the pull-down switch, among the clamp switches, and the first well are formed between a gate pattern of the first clamp switch and a gate pattern of the pull-down switch.

* * * * *